United States Patent [19]

Oliver

[11] Patent Number: 4,567,577
[45] Date of Patent: Jan. 28, 1986

[54] IMPEDANCE MODULATED CMOS RAM CELL

[75] Inventor: Arthur B. Oliver, Houston, Tex.

[73] Assignee: Texas Instruments Incorporated, Dallas, Tex.

[21] Appl. No.: 439,161

[22] Filed: Nov. 4, 1982

[51] Int. Cl.[4] ............................................. G11C 11/40
[52] U.S. Cl. .................................... 365/156; 365/181; 365/190
[58] Field of Search ............... 365/156, 181, 190, 202, 365/189

[56] References Cited

U.S. PATENT DOCUMENTS 3,968,479  7/1976  Goser .................................. 365/181

Primary Examiner—Joseph A. Popek
Attorney, Agent, or Firm—Robert D. Marshall; N. Rhys Merrett; Melvin Sharp

[57] ABSTRACT

A random access memory cell of complementary field effect transistors that include a bit storage latch for storing binary bit information connected to a word address line and a data address line. The data address line provides bit information to the latch. This bit data is stored in the latch when the word address line is active. A switching circuit is connected to the latch that enables new data to be stored in the latch by removing the previously stored data during the time that the new data is being stored.

4 Claims, 3 Drawing Figures

IMPEDANCE MODULATED CMOS RAM CELL

BACKGROUND OF THE INVENTION

1. Field of the Invention

This invention relates to digital computer memory storage and specifically to digital random access memory cells employing complementary field effect transistors.

2. Description of the Prior Art

The present invention includes a random access memory cell. Random access memory cells are of two basic types, static and dynamic. The present invention includes a static type of random access memory cell.

Random access memory cells in the prior art resemble the type of memory cell shown in the schematic in FIG. 1. The RAM cell in FIG. 1 contains the DATA line 1 and a DATA- line 12. DATA and DATA- are input to the RAM cell as shown when the WORD ADDRESS line 11 is active. The WORD ADDRESS line 11 actuates the transistors 5 and 6 to place data in the data latch. The data latch consists of transistors 1, 2, 3 and 4 that are connected to transistors 5 and 6 and are cross connected together. Transistors 1 and 2 are n-channel devices and transistors 3 and 4 are p-channel devices. When a 1 is to be written into the RAM cell, the RAM cell DATA line 1 is high and DATA- line 12 is low, the 0 from the DATA- line 12 will be coupled onto node 7 through transistor 6, overriding the "1" being held on node 8 by transistor 3; the 0 at node 7 will activate the p-channel transistor 4 and inactivate the n-channel transistor 2, forcing a 1 on nodes 9 and 10 which enables transistor 1 and reinforces the 0 on node 7 and 8. Therefore, the 0 that exists or the charge that exists in node 8 will be the same at node 7 and likewise, the charge that exists at node 10 will be the same at node 9. Therefore data has been written into the RAM cell. However, problems occur when new data is to be written into the RAM cell that alters the state of the device. If the threshold characteristics of both the n-channel and p-channel devices is about the same, then transistors 5 and 6 must have channels that are considerably wider than transistors 3 and 4 to eliminate the resistance in changing or altering the state of the data stored in the latch. In other words, data from DATA lines 1 and DATA- line 12 must overwrite the data that already exists in memory. As the design voltage for the CMOS RAM cells becomes smaller, this difference in size between the driving transistors 5 and 6 and the latch transistors 3 and 4 becomes greater. Drive transistors 5 and 6 must be increased to size to offset the voltage differential required to overwrite the data in the RAM cell. Therefore, as this design voltage decreases, the actual size of the RAM cell must increase in proportion to the remaining number of devices. This increase in RAM cell size is not desirable.

The object of the present invention is to provide a RAM cell that allows new data to be written into the cell altering the state of the cell at lower design voltages and smaller RAM cell sizes.

SUMMARY OF THE INVENTION

In accordance with the present invention, a random access memory cell is provided that includes a complementary field effect transistor circuit that further includes a latch for storing digital bit information connected to a word address line and a data address line. The data address line inputs bit information to the latch when the word address line is active. A switching circuit is connected to the latch for enabling new data to be stored in the latch by preventing the previous latch state from influencing the subsequent latch state.

In the preferred embodiment of this invention, a random access memory cell of complementary field effect transistors is provided that includes a latch for storing bit information connected to a word address line and a data address line. The data address line transmits or inputs bit information into the data latch when the address line is active. A switching circuit is connected to the latch that enables the data to be input in the latch by using the body effect of the n-channel transistors in the latch to turn off a portion of the latch, thus preventing the feedback of the previous latch state from influencing the next latch state.

BRIEF DESCRIPTION OF THE DRAWINGS

The novel features believed characteristic of the invention are set forth in the appended claims. The invention itself, however, as well as other features and advantages thereof, may best be understood by reference to the following detailed description of an illustrated embodiment, when read in conjunction with the accompanying drawings wherein:

DESCRIPTION OF THE PREFERRED EMBODIMENT

Figure 1:
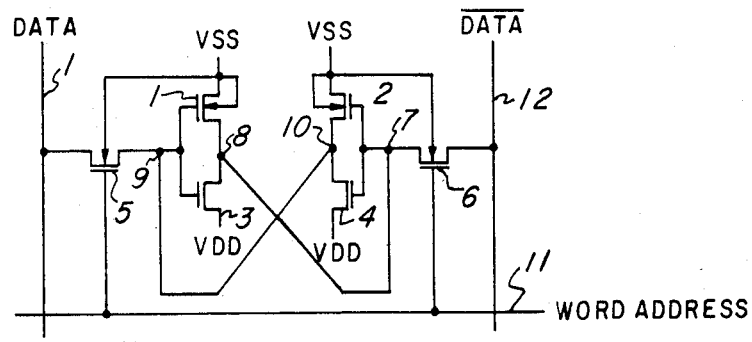
FIG. 1 is a schematic of the prior art RAM cell.

FIG. 1 illustrates the prior art RAM cell structure as discussed in the background. This invention is intended to overcome the problem that exists in the prior art in changing the state of the latch in the RAM cell illustrated in FIG. 1 without having the driving transistors 5 and 6 having to be increased in size in order to overdrive the transistors in the latch.

Figure 2:
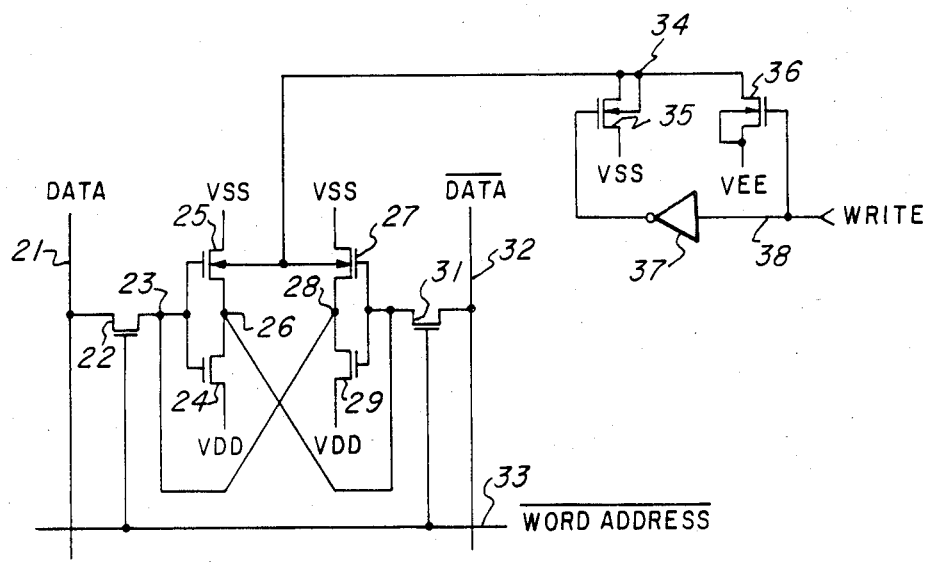
FIG. 2 is a schematic of the present invention RAM cell.

The schematic of this invention is illustrated in FIG. 2. The architecture of the RAM cell in FIG. 2 is relatively similar to the architecture of the RAM cell in FIG. 1, however, there are basic differences. The latch transistors 25 and 27 of the RAM cell in FIG. 2 are n-channel transistors as were the transistors 1 and 2 of the RAM cell in FIG. 1. However, note that the drive transistors 22 and 31 of the RAM cell in FIG. 2 are now p-channel transistors instead of n-channel transistors as were transistors 5 and 6 of the RAM cell in FIG. 1. In addition, there is switching circuitry including transistors 35, 36 that control the substrate of the n-channel transistors 25 and 27. The RAM cell in FIG. 2 receives data on the DATA line 21 and DATA- line 32 as before. Data on the DATA line 21 is input to the RAM cell through transistor 22 which now is activated by the WORD ADDRESS- line 33 (since this is a p-channel device). Thus a 1 input onto the RAM cell latch at node 23 will activate transistor 25 causing the negative charge from $v_{ss}$ to be placed on node 26 which places a negative charge at node 30 on the opposite side of the latch and causing transistor 29 to become active discharging any negative charge at node 28. This negative charge at node 30, of course is reinforced by the DATA- information on line 32. Likewise, the input of a logical "0" would be a reverse of the process.

Additional switching circuitry in FIG. 2 contain transistors 35 and 36 which are n-channel devices connected to $V_{ss}$ and $V_{ee}$, respectively. $V_{ee}$ is a more negative source than $V_{ss}$. Transistor 35 has its gate activated when the WRITE line 38 is inactive, thus activating the gate via inverter 37. Transistor 36 is activated when the WRITE line 38 is active. When transistor 35 is on the negative voltage $V_{ss}$ is placed onto the substrate of the transistors 25 and 27 causing them to function as normal n-channel devices. However, when the more negative $V_{ee}$ through transistor 36 is placed onto the substrate of the transistors 25 and 27, this more negative voltage $V_{ee}$ acts to turn off transistors 25 and 27 irrespective of the value on their gates. This effect is called a body effect and uses the so-called back gate bias to control transistors 25 and 27. This back gate bias causes the transistors 25 and 27 to turn off during the Write state allowing the voltages or charges at nodes 23 and 30 to be placed into the latch without having to overdrive or overpower the previous state of the latch.

Figure 3:
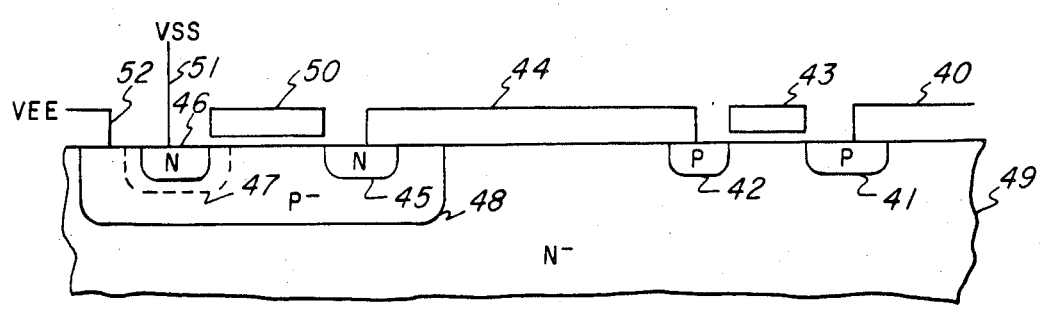
FIG. 3 is a cross-sectional view of the RAM cell structure of this invention.

FIG. 3 is a cross-sectional drawing of the structure of transistors 22 and 27 as shown in FIG. 2. The gate of transistor 22 or the drive transistor connected to the DATA line 21 is shown as 43. Gate 43 is activated by WORD ADDRESS- not shown. The data as input schematically is shown as line 40 to the p-doped area 41. When WORD ADDRESS- is active, gate 43 will be activated, thus allowing the data on line 40 to be transmitted through the transistor to the p-doped area 42. Schematically, a p-doped area 42 is electrically connected by a line 44 to the N-doped area 45 of the n-channel device. This line 44 in FIG. 3 corresponds to the line connecting nodes 23 and 28 in FIG. 2. Note, however, that the n-channel region 46 is connected to $V_{ss}$. The p-region forming the substrate of the transistor is connected to either $V_{ss}$ or $V_{ee}$. When the p-doped area 48 is connected to $V_{ee}$, there is a region 47 formed around the n-doped region 46 that results in the transistor being pinched off or turned off by the back bias voltage on the p-region 48. This back bias then effectively depletes the region 47 around the n-doped region 46 to turn off this device.

I claim:

1. A random access memory cell of complementary field effect transistors comprising:
   a latch for storing bit information connected to a word address line and a data line to receive bit information from said data line when said word address line is active, said latch including first and second inverter circuits, each of said inverter circuits having an output coupled to the input of the other inverter circuit;
   switching means connected to said latch for enablng new data information to be stored in said latch by disabling a portion of each of said first and second inverter circuits of said latch.

2. A random access memory cell according to claim 1 wherein said first inverter circuit includes a first n-channel field effect transistor and a first p-channel field effect transistor, said second inverter circuit includes a second n-channel field effect transistor and a second p-channel field effect transistor and said switching means being connected to said first and second n-channel field effect transistors to disable said first and second n-channel field effect transistors during storage of new data information.

3. A random access memory cell of complementary field effect devices comprising:
   a latch circuit for storing bit information by assuming one of two stable states including (1) a first inverter circuit including a pair of complementary field effect devices having a first input connected to a first node and a first output connected to a second node and (2) a second inverter circuit including a pair of complementary field effect devices having a second input connected to said second node and a second output connected to said first node, said latch circuit operating whereby said first and second inverter circuits assume opposite states;
   a word address line having an active signal thereon upon selection of said latch circuit;
   a data line having a data signal to be written into said memory cell thereon upon selection of said latch circuit;
   a data complement line having the complement of said data signal thereon upon selection of said latch circuit;
   a first write drive field effect device having a source connected to said data line, a drain connected to said first node of said latch circuit and a gate connected to said word address line;
   a second write drive field effect device having a source connected to said data complement line, a drain connected to said second node of said latch circuit and a gate connected to said word address line; and
   a switching means connected to said latch circuit for disabling a portion of said first and second inverter circuits to enable writing into said latch circuit.

4. A random access memory cell of complementary field effect devices as claimed in claim 3, wherein:
   said first inverter circuit includes a first n-channel field effect device and a first p-channel field effect device;
   said second inverter circuit includes a second n-channel field effect device and a second p-channel field effect device; and
   said switching means is connected to said first and second n-channel field effect devices to disable said first and second n-channel field effect devices upon writing into said latch circuit.

* * * * *